United States Patent
Swaans et al.

(10) Patent No.: US 12,266,948 B2
(45) Date of Patent: Apr. 1, 2025

(54) TESTING DEVICE FOR TESTING A WIRELESS POWER DEVICE, AND AN ASSOCIATED METHOD

(71) Applicant: ElectDis AB, Malmo (SE)

(72) Inventors: Laurens Swaans, Malmö (SE); Filip Dahlberg, Malmö (SE); Max Andersson, Malmö (SE); Tony Tillerkvist, Kristianstad (SE)

(73) Assignee: ElectDis AB, Malmo (SE)

( * ) Notice: Subject to any disclaimer, the term of this patent is extended or adjusted under 35 U.S.C. 154(b) by 0 days.

(21) Appl. No.: 18/005,470

(22) PCT Filed: Jul. 12, 2021

(86) PCT No.: PCT/EP2021/069263
§ 371 (c)(1),
(2) Date: Jan. 13, 2023

(87) PCT Pub. No.: WO2022/017842
PCT Pub. Date: Jan. 27, 2022

(65) Prior Publication Data
US 2023/0268780 A1 Aug. 24, 2023

(30) Foreign Application Priority Data
Jul. 23, 2020 (EP) .................... 20187446

(51) Int. Cl.
*H02J 50/60* (2016.01)
*G01R 31/40* (2020.01)
(Continued)

(52) U.S. Cl.
CPC ............. *H02J 50/60* (2016.02); *G01R 31/40* (2013.01); *H02J 50/10* (2016.02); *H02J 50/90* (2016.02)

(58) Field of Classification Search
CPC . H02J 50/60; H02J 50/90; H02J 50/10; G01R 31/40
See application file for complete search history.

(56) References Cited

U.S. PATENT DOCUMENTS 10,607,487 B2 * 3/2020 Nishida ................ B60L 53/124
2019/0068001 A1 * 2/2019 Lovas ..................... H02J 50/60
(Continued)

FOREIGN PATENT DOCUMENTS

CN 104166166 A 11/2014
CN 107947381 A 4/2018
(Continued)

OTHER PUBLICATIONS

Extended European Search Report issued in Application No. 20187446.8 dated Dec. 8, 2020, 9 pages.
(Continued)

*Primary Examiner* — Menatoallah Youssef
*Assistant Examiner* — Khareem E Almo
(74) *Attorney, Agent, or Firm* — Honigman LLP

(57) ABSTRACT

A foreign object emulation device (60; 160; 260) for testing foreign object detection of a wireless power device (10; 20) is provided. The foreign object emulation device (60; 160; 260) is in operative communication with a processing means (61; 42; 52). The foreign object emulation device (60; 160; 260) comprises a main body (68; 168; 268) being arranged with at least one emulated object (66; 166*a-b;* 266), a sensor unit (64) comprising at least one temperature sensor (64*a*) configured to transmit temperature data to the processing means (61; 42; 52), wherein the temperature data is indicative of the temperature of the at least one emulated object (66; 166*a-b;* 266), and means for causing a controlled
(Continued)

relative movement between the at least one emulated object (66; 166*a*, 166*b*) and the wireless power device (10; 20) being tested.

13 Claims, 13 Drawing Sheets

(51) Int. Cl.
*H02J 50/10* (2016.01)
*H02J 50/90* (2016.01)

(56) References Cited

U.S. PATENT DOCUMENTS

| | | | |
|---|---|---|---|
| 2019/0222066 A1* | 7/2019 | Kozakai | H02J 50/60 |
| 2020/0067353 A1 | 2/2020 | Kapoor et al. | |
| 2023/0268780 A1* | 8/2023 | Swaans | H02J 50/60 |
| | | | 307/104 |

FOREIGN PATENT DOCUMENTS

| | | |
|---|---|---|
| CN | 210123910 U | 3/2020 |
| EP | 2963763 A1 | 1/2016 |

OTHER PUBLICATIONS

International Preliminary Report on Patentability issued in Application No. 20187446.8 dated Oct. 19, 2022.
Nok9: "CATS (TM) I Base Station Tester", Feb. 28, 2028, pp. 1-8.
Chinese Patent Office, Search Report for Application 2021800611342 dated Jun. 14, 2024.

* cited by examiner

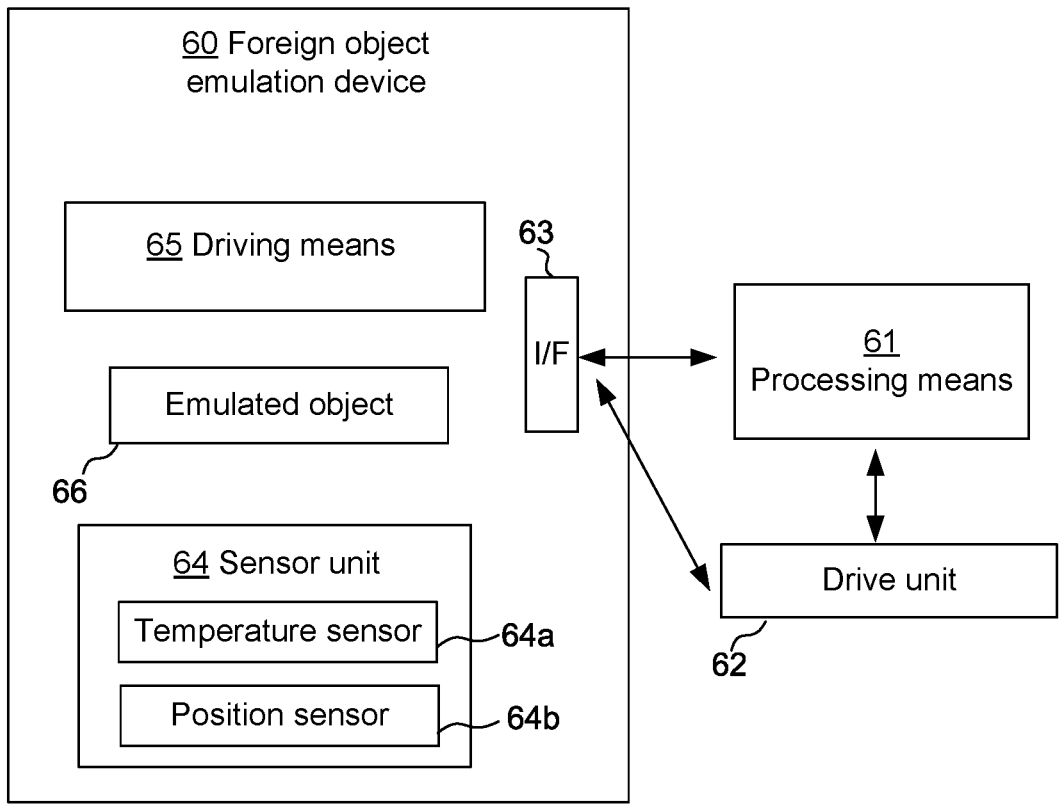
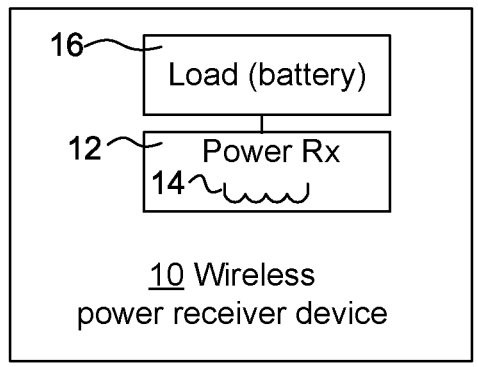
Fig. 2b

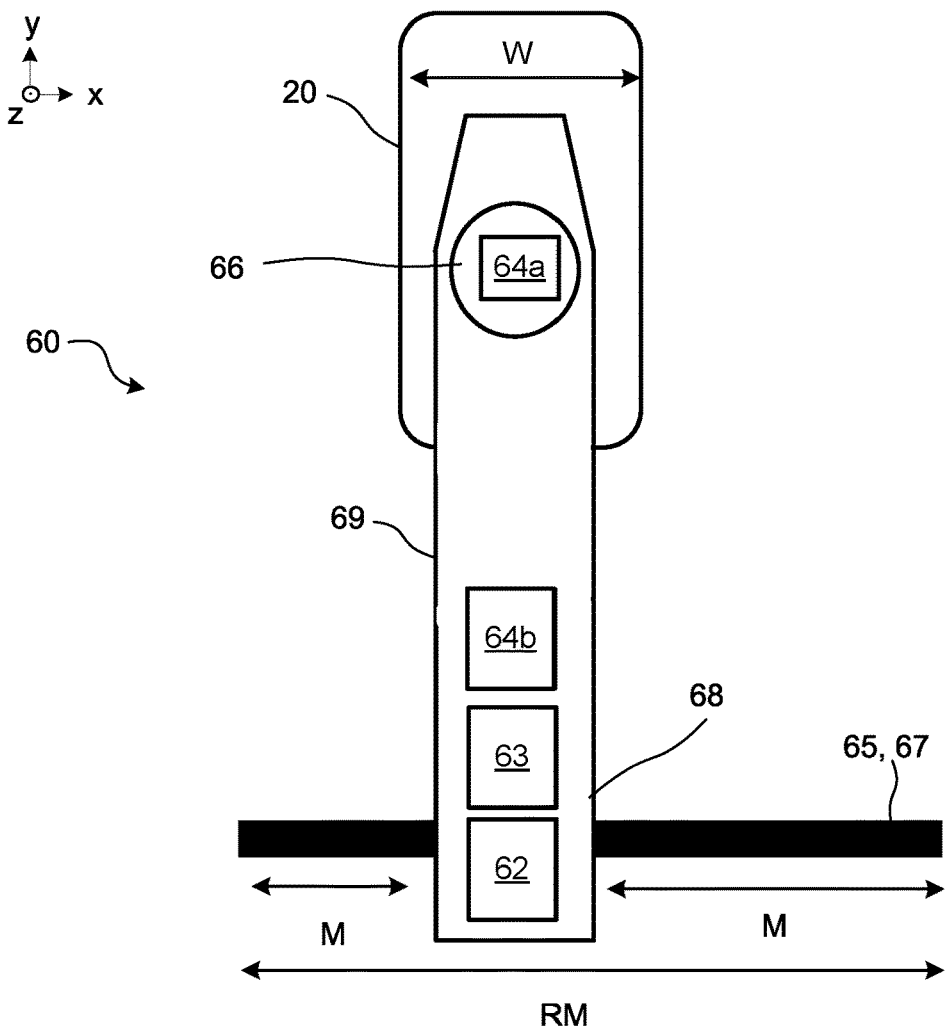
*Fig. 4*
*Fig. 5a*  *Fig. 5b*
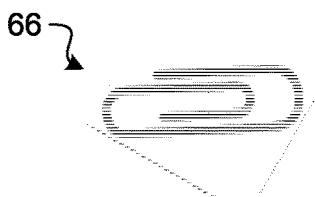
*Fig. 5c*  *Fig. 5d*

TESTING DEVICE FOR TESTING A WIRELESS POWER DEVICE, AND AN ASSOCIATED METHOD

CROSS-REFERENCE TO RELATED APPLICATIONS

The present application is a national stage application under 35 U.S.C. 371 of International Application No. PCT/EP2021/069263, filed on Jul. 12, 2021, which claims priority to European Patent Application Serial No. 20187446.8, filed Jul. 23, 2020, both of which are hereby incorporated by reference in their entirety.

TECHNICAL FIELD

The present invention generally relates to the field of wireless power transfer, and more specifically to testing of wireless power transfer between a wireless power device and a testing device. Even more specifically, the present invention relates to a testing device for use in testing of wireless power devices having at least one wireless power transfer coil, where the testing device is configured to test how the wireless power transmitter and/or receiver device reacts to foreign objects. The present invention also relates to a method of testing the performance of wireless power transfer from a wireless power transmitter device having at least one wireless power transmitter coil.

BACKGROUND

Wireless power transfer is expected to become increasingly popular, for instance for wireless battery charging of mobile devices such as, for instance, mobile terminals, tablet computers, laptop computers, cameras, audio players, rechargeable toothbrushes, wireless headsets, as well as various other consumer products and appliances.

The Wireless Power Consortium has developed a wireless power transfer standard known as Qi. Other known wireless power transfer approaches include Alliance for Wireless Power, and Power Matters Alliance.

The wireless power transfer standard known as Qi by the Wireless Power Consortium will be referred to, without limitation, throughout this document as the presently preferred wireless power transfer manner applicable to the present invention. However, the invention may generally be applied also to other wireless power transfer standards or approaches, including but not limited to the ones mentioned above. Operation of devices that comply with Qi relies on magnetic induction between planar coils. Two kinds of devices are involved, namely devices that provide wireless power (referred to as base stations or wireless power transmitter devices), and devices that consume wireless power (referred to as mobile devices). Power transfer takes place from a base station to a mobile device. For this purpose, a base station contains a subsystem (a power transmitter) that comprises a primary coil, whereas a mobile device contains a subsystem (a power receiver) that comprises a secondary coil. In operation, the primary coil and the secondary coil will constitute the two halves of a coreless resonant transformer. Typically, a base station has a flat surface, on top of which a user can place one or more mobile devices so as to enjoy wireless battery charging or operational power supply for the mobile device(s) placed on the base station.

During operation, many different factors affect the quality of the wireless charging. For example, heat can be generated by magnetic induction in metal parts of the power receiver that are exposed to the magnetic field generated by the wireless power transmitter device. If the mobile device and/or the base station are exposed to excessive thermal exposure, several undesired effects may arise, for example damaging vital components in the mobile device or a reduced performance. Moreover, the charging efficiency, and thus the charging period needed, may vary depending on the orientation of the power receiver on the base station.

Another factor that affects the quality of the wireless charging is when a foreign object is placed in between the mobile device and the base station. A foreign object is in this context seen as any object that is not part of either the wireless power transmitter or wireless power receiver device and could cause unexpected losses to wireless power transfer. The energy absorbed by the foreign object is likely to result in the (unintentional) heating of the foreign object. This can lead to severe safety concerns when the temperature exceeds human safety thresholds. On top of that, excessive temperatures can cause irreparable damage to either device in close proximity of the foreign object.

In order to comply with the Wireless Power Consortium, a Base Station (Wireless Power Transmitter) or PTx, needs to have a foreign object detection functionality that interrupts the wireless power transfer and/or does not start the transfer at all when a foreign object is positioned in such a way that it could cause aforementioned undesired heating effects. Different kinds of foreign object detection methods exist, for example the Q-factor method and the loss balance method. The Q-factor method is used before the power transfer phase, whereas the loss balance method is used during the power transfer stage.

There is thus a need to test and evaluate such foreign object detection functionality in the base stations in an accurate and cost-effective way. The state of the art in Qi compliance testing requires manual positioning of the wireless power devices and several representative foreign objects relative to each other. This is tedious, takes a lot of time and is prone to operator error. For example, some manufacturers of wireless power transmitter products utilize a robot to move the Foreign Object and another robot to move the Power Receiver product and complete an elaborate positioning scheme across the entire charging surface of the transmitter product. Cables connecting both FO and receiver product to controllers can cause interference or become intertwined and the need for synchronized movement puts extra requirements on the positioning system. On top of this, since the topic of testing concerns detection of metals it is very important that apart from the FO, there is no additional metal (or electrically conductive materials) introduced in the close vicinity of the electromagnetic field. It should be clear that building a comprehensive test setup involves a significant effort, cost and complexity. For that reason, the vast majority of production lines have a simple test scenario where an object is inserted at a single or few fixed locations and the performance is gaged based on these few results. This is quite a sacrifice to make for a safety feature in consumer or even automotive grade products.

SUMMARY

It is an object of the invention to offer improvements in the technical field of wireless power transfer.

In a first aspect, a foreign object emulation device for testing foreign object detection of a wireless power device having at least one wireless power coil is provided. The foreign object emulation device is in operative communication with a processing means. The foreign object emulation device comprises a main body being arranged with at least one emulated object, a sensor unit comprising at least one temperature sensor configured to transmit temperature data to the processing means, wherein the temperature data is indicative of the temperature of the at least one emulated object and means for causing controlled relative movement between the at least one emulated object and the wireless power device being tested.

The means for causing a controlled relative movement may be a driving means being adapted to cause a controlled relative movement. The movement may be of the at least one emulated object in relation to the wireless power device being tested.

In one embodiment, the means for causing controlled relative movement is in operative communication with a drive unit.

In one embodiment, the wireless power device is a wireless power transmitter device in the form of a wireless charger. In one embodiment the wireless power device is a wireless power receiver device.

In one embodiment, the processing means is configured to receive the temperature data, and at least based on said temperature data instruct the drive unit to move the at least one emulated object and/or to move the wireless power device being tested. The temperature data may be transmitted to the processing means using wireless communication. The wireless communication may be Bluetooth.

In one embodiment, the foreign object emulation device is in operative communication with at least one position sensor configured to transmit position data to the processing means, wherein the position data is indicative of the position of the at least one emulated object in relation to the wireless power device. The processing means may be configured to receive the position data, and at least based on said temperature data instruct the drive unit to move the at least one emulated object and/or to move the wireless power device.

In one embodiment, the foreign object emulation device further comprising a longitudinal arrangement (configured to guide the movement of the at least one emulated object.

The at least one emulated object may be removable attached to the main body of the foreign object emulation device.

In one embodiment, the foreign object emulation device further comprises a probe device.

In a second aspect, a system for testing foreign object detection of a wireless power device having at least one wireless power coil is provided. The system comprises a foreign object emulation device and a host device being arranged with a processing means. The system may further comprise a probe device.

In a third aspect, a method for testing foreign object detection of a wireless power device having at least one wireless power coil is provided. The method comprises providing a foreign object emulation device having a main body being arranged with at least one emulated object, means for causing controlled relative movement between the at least one emulated object and the wireless power device being tested and a sensor unit comprising at least one temperature sensor. The method comprises causing a controlled relative movement of the emulated object and the wireless power device being tested. The method further comprises transmitting temperature data, generated by the at least one temperature sensor, being indicative of the temperature of the at least one emulated object to a processing means being in operative communication with the foreign object emulation device.

The method may further comprise receiving, by the processing means, said temperature data, and at least based on said temperature data, transmitting instructions to cause a relative movement the at least one emulated object. The method may further comprise causing a relative movement of the at least one emulated object or moving the wireless power device.

In one embodiment the foreign object emulation device is operative communication with at least one position sensor, wherein the method further comprises transmitting position data, generated by the at least one position sensor being indicative of the position of the at least one emulated to the processing means.

In a fourth aspect, a computer readable storage medium encoded with instructions that, when loaded and executed by a processing means, cause the method according the third aspect to be performed is provided.

In a fifth aspect, a computer program product comprising code instructions which, when loaded and executed by a processing means, cause the method according to the third aspect to be performed is provided.

BRIEF DESCRIPTION OF THE DRAWINGS

Objects, features and advantages of embodiments of the invention will appear from the following detailed description, reference being made to the accompanying drawings.

FIG. 4 is a schematic view of a foreign object emulation device according to one embodiment.

FIGS. 5a-d are schematic views of emulated objects according to different embodiments.

DETAILED DESCRIPTION

Figure 1:
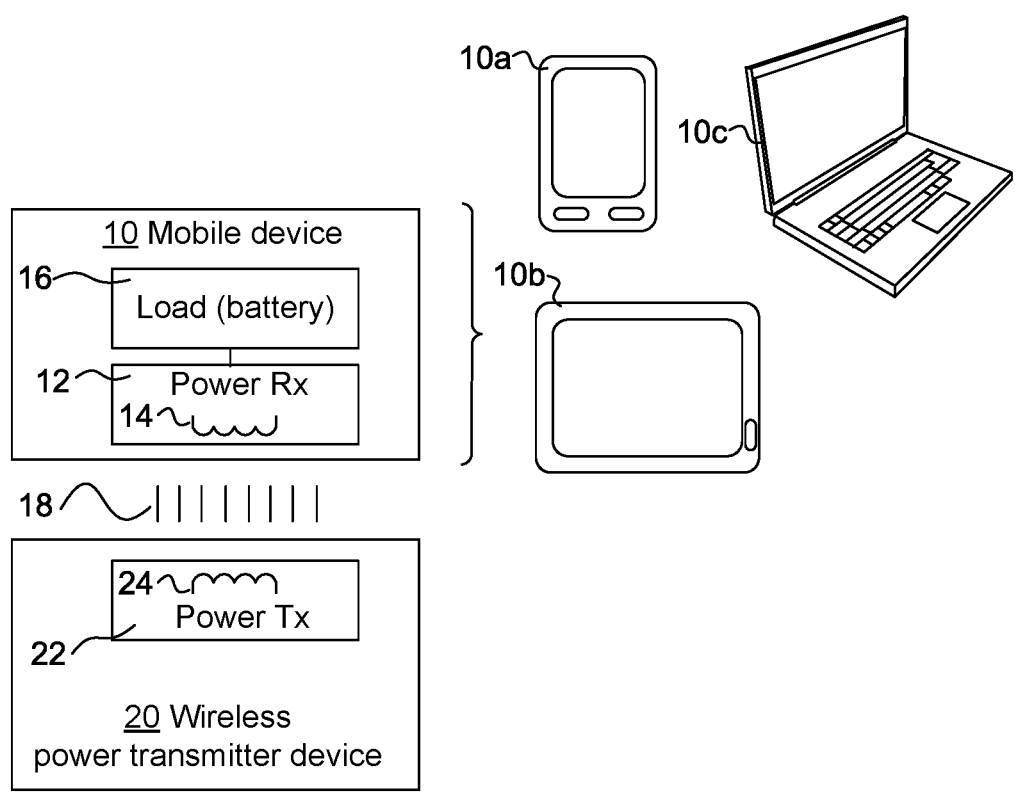
FIG. 1 is a schematic block diagram of a wireless power transmitter device for wireless power transfer to a mobile device.

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements.

FIG. 1 illustrates a wireless power transmitter device 20 for wireless power transfer to a wireless power receiver device 10. The wireless power receiver device 10 may be a mobile device. The mobile device 10 may, for instance, be a mobile terminal (e.g. smartphone) 10a, tablet computer 10b (e.g. surfpad), laptop computer 10c, camera, audio player, rechargeable toothbrush, wireless headset, or another kind of consumer product or appliance.

The wireless power transfer will be described as being compliant with the Qi standard by the Wireless Power Consortium; hence, the wireless power transmitter device 20 is a base station in the Qi terminology. However, as already mentioned, the invention is generally applicable also to other wireless power transfer standards or approaches, including but not limited to the ones mentioned in the Background section.

The wireless power transmitter device 20 comprises a wireless power transmitter 22 having at least one wireless power transmitter coil 24. The transmitter device 20 may have a plurality of transmitter coils. The transmitter coils can be arranged in a spaced apart arrangement and/or in a partly overlapping manner.

The wireless power receiver device 10 comprises a wireless power receiver 12 having a wireless power receiver coil 14. In operation, the wireless power transmitter device 20 will transfer power wirelessly to the wireless power receiver device 10 by way of magnetic induction 18 via the wireless power transmitter coil 24 and wireless power receiver coil 14.

The power received by the wireless power receiver coil 14 will drive a load 16 in the wireless power receiver device 10. Typically, the load 16 may be a rechargeable battery, such as a lithium ion battery: hence, the wireless power transmitter device 20 will act as a wireless power charger for the wireless power receiver device 10. In another scenario, the load 16 may be electronic circuitry in the mobile device, wherein the wireless power transmitter device 20 will act as a wireless power supply for the wireless power receiver device 10.

As stated in the background section, a foreign object being placed in between the mobile device and the base station affects the quality of the wireless charging. This may cause unexpected losses to the wireless power transfer as well as causing unintentional heating of the foreign object. A foreign object is to be seen as any object that causes unexpected losses to wireless power transfer. This may for example be small metal objects such as coins, paper clips, pieces of foils, pharmaceutical wrappers, metal-foil-and-paper wrapper from chewing gum, cigarette packages and fast food wrappers and similar small and/or thin items.

The wireless power transmitter device 20 thus preferably comprises a foreign object detection functionality. A foreign object detection functionality is a safety mechanism which automatically interrupts power delivery if there is interference caused by a foreign object. If no foreign object detection is present or is malfunctioning, small metal objects can when placed between the transmitter and the mobile device heat up to over 100° C. in a matter of seconds and cause dramatic consequences. Furthermore, power receiver device 10 may also benefit from having a foreign object detection functionality. In the following, the terminology wireless power device is to be seen as covering both the wireless power transmitter device 20 and the power receiver device 10.

In order to test how a wireless power device, such as a wireless power transmitter device 20 or wireless power receiver device 10, reacts to a foreign object, a foreign object emulation device 60 has been provided, embodiments of which are illustrated in FIGS. 2 to 8. The foreign object emulation device 60 is thus a test device configured to test the foreign object detection methods of the wireless power transmitter and/or receiver device in an automatic way.

Figure 2A:
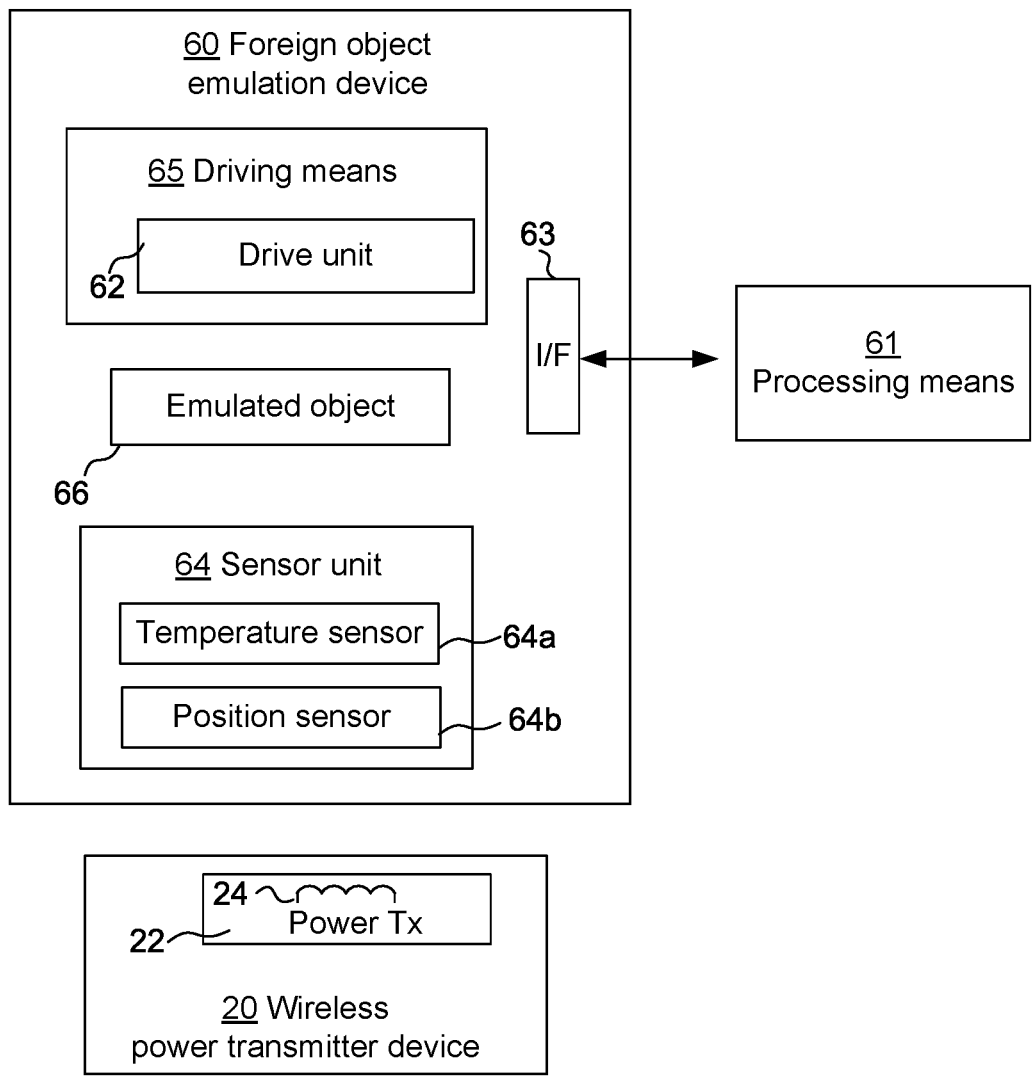
FIG. 2 is a schematic block diagram of a foreign object emulation device for use in testing of a wireless power transmitter device according to one embodiment.

FIGS. 2a-b are schematic block diagrams that shows an embodiment of a foreign object emulation device 60 for testing a wireless power device (device under test. In FIG. 2a, the foreign object emulation device 60 is arranged to test a wireless power transmitter device 20, and in FIG. 2b, the foreign object emulation device 60 is arranged to test a wireless power receiver device 10.

In FIG. 2a, the foreign object emulation device 60 is arranged to test a wireless power transmitter device 20 having a wireless power transmitter 22 and at least one wireless power transmitter coil 24. The wireless power transmitter device 20 may be identical to the wireless power transmitter device 20 in FIG. 1.

The foreign object emulation device 60 comprises at least one emulated object 66 that is configured to act as a foreign object. Each emulated object 66 is arranged with specific characteristics, such as size, shape and material in order to emulate a foreign object such as coins, paper clips, pieces of foils, pharmaceutical wrappers and so on. The emulated object 66 will be discussed further with reference to FIG. 3.

The foreign object emulation device 60 further comprises a sensor unit 64. The sensor unit 64 comprises at least one sensor. The at least one sensor includes a temperature sensor 64a. The temperature sensor may also be referred to as a thermal sensor. In the exemplified embodiment shown in FIG. 2, the sensor unit 64 comprises at least one temperature sensor 64a and at least one position sensor 64b. The sensor unit 64 will be described in detail with reference to FIG. 3. As will be described more in detail later on, the position sensor 64b, if present, could be arranged in the foreign object emulation device 60 as shown in FIG. 2, or be arranged externally of the foreign object emulation device 60 (not shown). In either case, the position sensor 64b is in operative communication with the object emulation device 60.

Moreover, the foreign object emulation device 60 preferably comprises means 65 for causing controlled relative movement between the at least one emulated object 66 and the wireless power deice 10, 20 being tested. Hence, the means 65 for causing controlled movement is arranged to control the movement of the at least one emulated object 66 and/or the movement of the wireless power device 10, 20. The means 65 for causing controlled relative movement is in operative communication with a drive unit 62 that causes the movement of the at least one emulated object 66 and/or the wireless power device 10, 20 being tested. The drive unit 62 may be part of the foreign object emulation device 60 (FIG. 2a) or be arranged externally of the device 60 (FIG. 2b). The means for causing controlled relative movement may for example be a track, frame, a rod or similar arrangement that allows the relative movement to be controlled in a precise manner. The means for causing a controlled relative movement may be a driving means that is adapted to cause the controlled relative movement by instructing the drive unit 62 to cause the movement of the at least one emulated object 66 and/or the wireless power device 10; 20 being tested.

The means 65 for causing controlled relative movement and the drive unit 62 will be described in detail with reference to FIG. 3.

Preferably, the foreign object emulation device 60 further comprises an interface 63 for transmitting the data obtained by the foreign object emulation device 60. The interface 63 may be of any suitable type, including simple wiring, a serial interface such as USB, a wireless interface such as Bluetooth or WiFi, etc. In a preferred embodiment, the interface is Bluetooth, and more preferably Bluetooth Low Energy (BLE). The interface 63 is configured to transmit data from the foreign object emulation device 60 to a processing means 61 to which it is in operative communication with.

The processing means 61 may comprise a programmable device, such as a microcontroller, central processing unit (CPU), digital signal processor (DSP) or field-programmable gate array (FPGA) with appropriate software and/or firmware, and/or dedicated hardware such as an application-specific integrated circuit (ASIC). The processing means 61 can be connected to or comprises a computer readable storage medium such as a disk or memory. The memory may be implemented using any commonly known technology for computer-readable memories such as ROM, RAM, SRAM, DRAM, FLASH, DDR, SDRAM or some other memory technology. The processing means 61 may be part of the foreign object emulation device 60, be a separate unit, be part of a host device (as shown in FIG. 7) or be part of a greater testing device (as shown in FIG. 8).

As previously been mentioned, FIG. 2*b* illustrates a foreign object emulation device 60 arranged to test a wireless power receiver device 10. Here, the foreign object emulation device 60 is arranged to test a wireless power receiver device 10 having a wireless power receiver 12 and at least one wireless power receiver coil 14. The wireless power receiver device 10 may be identical to the wireless power receiver device 10 in FIG. 1.

Moreover, in FIG. 2*b*, the drive unit 62 is arranged externally of the foreign object emulation device 60. The foreign object emulation device 60 is in operative communication with the drive unit 62. This communication can be made from the interface 63 directly to the drive unit 62, and/or from the interface 63 to the processing means 61 and to the drive unit 62, and vice versa.

Figure 3A:
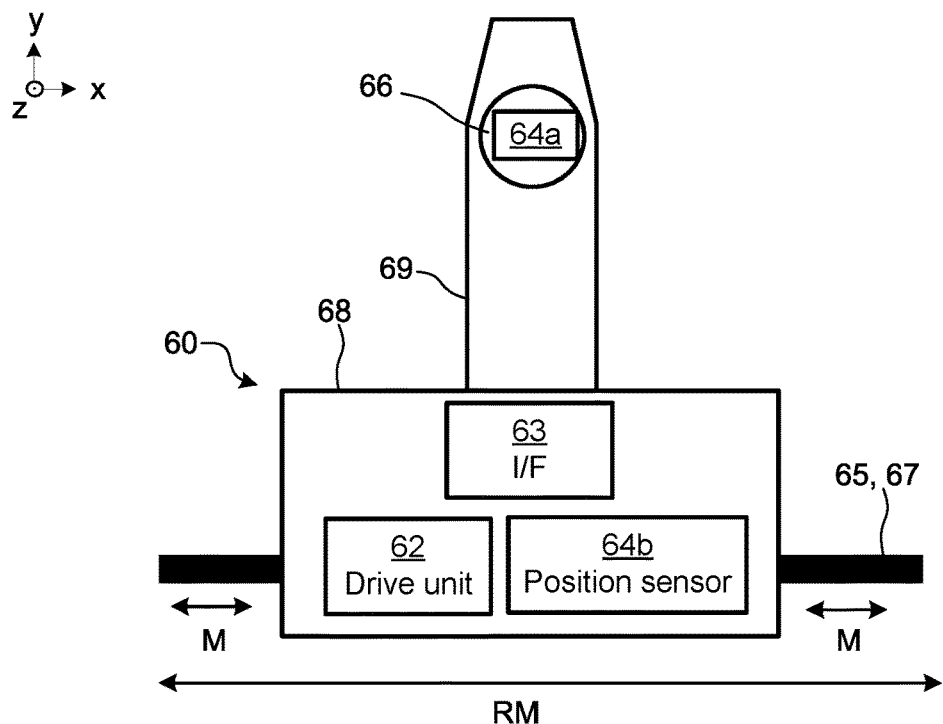
FIGS. 3a-b are schematic views of a foreign object emulation device according to one embodiment.
Figure 3B:
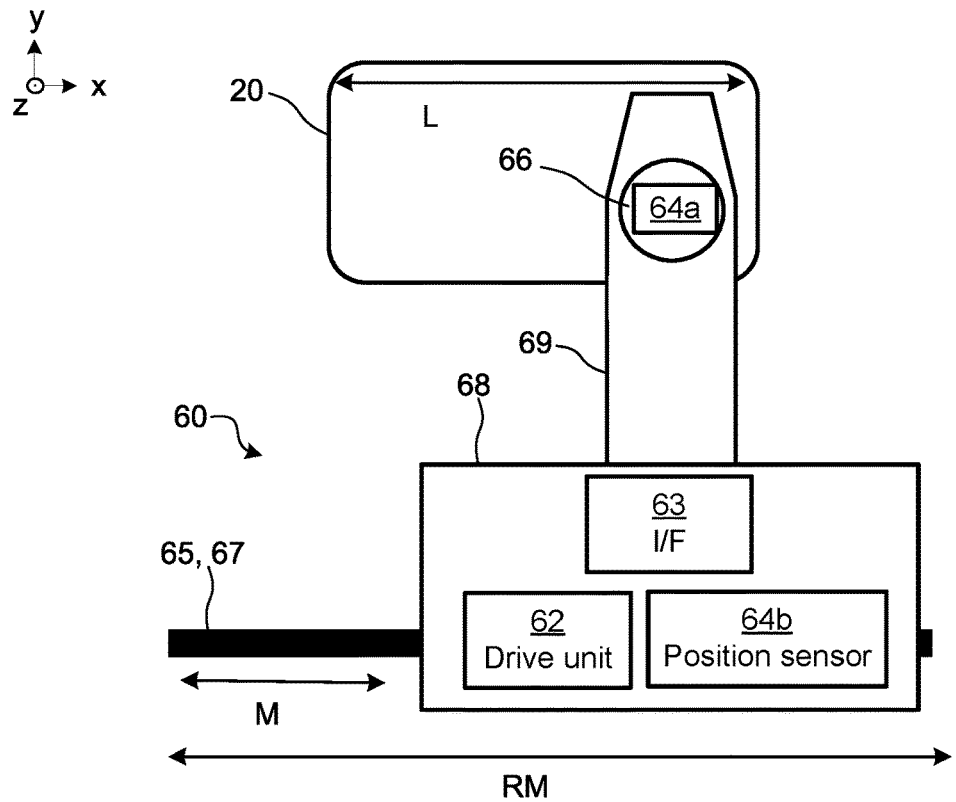

FIGS. 3*a-b* are schematic top view illustrations of one embodiment of a foreign object emulation device 60 where FIG. 3*a* is shown without a wireless power device 10, 20 to be tested, and FIG. 3*b* is shown with the wireless power transmitter device 20 being tested. In these embodiments, the device under test is the wireless power transmitter device 20, however as has been described herein the device under test could alternatively be the wireless power receive device 10.

In this embodiment the foreign object emulation device 60 comprises a main body 68. The main body 68 may be constructed by any form of plastic, such as for example an organic thermoplastic polymer. The organic thermoplastic polymer may for example be Polyether ether ketone (PEEK). It is preferably if the material of the main body is not metallic, as it would interfere with the wireless power transmitter device 20 being tested.

The main body comprises an arm 69 that extends from the rest of the body 68. The arm is arranged with the at least one emulated object 66. The emulated object 66 is preferably removable attached to the foreign object emulation device 60. In this way, it is possible to change between different emulated objects 66 in order to test the wireless power transmitter device 20 against different simulated foreign objects.

In one embodiment, the arm 69 is constructed by a composite material. The composite material may for example be FR4 which is commonly used for Printed Circuit Boards (PCBs). This would make it very simple to connect the temperature sensor and a simple board-to-board connector can make the connection with the main body 68

In FIG. 3*b*, the emulated object 66 is arranged above the wireless power device 20. It is preferred if the height of the arm 69 is adaptable to account for different distances between the wireless power device 20 to be tested and the foreign object emulation device 60. In other words, the arm 69 and the emulated objects 66 may be moved in a z-direction.

Although not shown, in other embodiments of the foreign object emulation device 60 the wireless power device 20 can be arranged above the emulated objects 66. Hence, the emulated objects 66 is arranged below the wireless power device 20.

As previously described, the foreign object emulation device 60 comprises at least one temperature sensor 64*a*. The temperature sensor 64*a* is configured to measure the temperature of the emulated object 66. The temperature sensor 64 is thus preferably arranged in, on or near the emulated object 66. In one embodiment, the temperature sensor 64*a* is integrated into the emulated object 66. In an alternative embodiment the temperature sensor 64*a* is arranged below the emulated object 66 such that the emulated object 66 is arranged on top of the temperature sensor 64*a*. Hence, the temperature sensor 64*a* may be arranged on the arm 69 of the main body 68. The temperature readings from the temperature sensor 64*a* are transferred to the interface 63, which communicates the temperature information to the processing means 61.

The temperature sensor 64*a* may be any kind of temperature sensor, for example thermocouples, resistor temperature detectors, thermistors, infrared sensors, semiconductors and/or thermometers. In one embodiment the temperature sensor is a multi-sensor high accuracy digital temperature measurement system. It is preferred if the temperature sensor 64*a* is configured to digitally output the results in ° C. or ° F. with both high accuracy and resolution. For example, it is preferred if the temperature sensor 64*a* can output the temperature results with 0.1° C. accuracy and 0.001° C. resolution.

In one embodiment, at least a part of the foreign object emulation device 60 is configured to move relative the wireless power device 20. Hence, at least a part of the foreign object emulation device 60 is moved relative the wireless power device 20. The movement of at least a part of the foreign object emulation device 60 is performed by a means 65 for causing controlled relative movement. The means 65 for causing controlled relative movement is in operative communication with a drive unit 62. In this embodiment, the drive unit 62 is arranged as a part of the foreign object emulation device 60. However, the drive unit 62 could also be arranged outside of the foreign object emulation device 60 as is shown in FIG. 2*b*.

The drive unit 62 may be a motor such as an electrical motor. In one embodiment the drive unit 62 is a brushless DC electric motor. The brushless DC electric motor may be a stepper motor. A stepper motor divides a full rotation into a number of equal steps. A benefit with a stepper motor is that it is possible to move and hold at one of these steps without having a position sensor for feedback. However, the use of a separate position sensor may still be beneficial.

The foreign object emulation device 60 may optionally comprise a position sensor 64b. The position sensor 64b is configured to monitor the movement of least a part of the foreign object emulation device 60 and/or the (relative) position of the wireless power device 20. The position sensor 64b may be configured to determine the absolute position of the emulated object 66 or determine the relative position (displacement) of the emulated object 66 relative to a starting position. It is preferred if the position sensor 64b used is of high precision in order to detect incremental steps of movement of the emulated object 66. In one embodiment, the position sensor 64b is a linear position sensor. The linear position sensor could for example be a linear potentiometer, capacitive position sensor, a laser sensor, or an incremental linear encoder. The position sensor 64b could be arranged as a part of the drive unit 62 or arranged as a separate unit. The position sensor 64b could be arranged externally of the foreign object emulation device 60, being in operative communication with the foreign object emulation device 60 and/or the processor 61.

In the embodiment in FIGS. 3a-b, the movement of at least a part of the foreign object emulation device 60 is performed along a longitudinal arrangement 67 that extends along the length or width of the foreign object emulation device 60. The extension is along the x-axis as illustrated in the Figures. The longitudinal arrangement 67 may for example be a rack or a rod. In one embodiment the longitudinal arrangement 67 is a rack configured to receive a pinion (not shown) arranged in conjunction with the drive unit 62. In this embodiment, the longitudinal arrangement 67 can be seen as the means 65 for causing a controlled movement or as a part of the means 65 for causing a controlled movement. This configuration allows the foreign object emulation device 60 to move in small incremental steps. It is preferred if the steps are in the sub-millimeter scale.

The movement of at least a part of the foreign object emulation device 60 may be in the lengthwise direction illustrated in FIGS. 3a-b with the arrow "M". In this embodiment, the direction is along the x-axis. In one embodiment, the movement M is in a direction along the length of the wireless power device 20 while lying on a surface. However, as should be understood, the movement M could be along the width of the wireless power device 20 while lying on a surface, if the device is turned (as shown in FIG. 4).

Although not shown, it should be realized that the movement could be in multiple directions in a single embodiment as well, for example in a direction along the y-axis, i.e. in a direction forward and backwards. This could for example be achieved by moving the arm 69 relative the main body 68 and/or by having a telescopically arranged arm 69 that is able to be lengthen or shortened during the test.

Moreover, the entire foreign object emulation device 60 could be moved in the y-direction (or z-direction) to achieve motion in a plane or in a volume.

The range of movement RM of the foreign object emulation device 60 is preferably such so that the emulated object 66 can be moved along the whole length of the wireless power device 20. This ensures that the wireless power device 20 can be tested for foreign objects being arranged along the whole length of the wireless power device 20. It is thus preferred if the range of movement RM is at least the same or larger than the length L (illustrated in FIG. 3b) of the wireless power device 20. The same applies for the width W (illustrated in FIG. 4) of the device. The range of movement RM is determined by the length of the longitudinal arrangement 67. Hence, it is preferred if the length of the longitudinal arrangement 67 is at least the same or larger than the length L of the wireless power device 20.

In one embodiment, as shown in FIGS. 3a-b, the whole main body 68 is moving relative to the wireless power device 20. Hence, both the arm 69 arranged to hold the emulated object 66 as well the rest of the main body 68 is moving relative the wireless power transmitter device 20. In other words, the main body 68 is moved along the longitudinal arrangement 67 along the x-axis. This is illustrated in FIG. 3b, where the main body 68 has been moved relative the position as shown in FIG. 3a.

FIG. 4 is a schematic top view illustration of one embodiment of a foreign object emulation device 60 according to a second embodiment. The embodiment shown in FIG. 4 differs from the embodiment of FIG. 3 in that the main body 68 has the form of an arm 69. Hence, the arm 69 and the main body 68 are the same. Hence, in this embodiment the drive unit 62 causes the movement of the main body 68, being arranged with the emulated object 66, relative the wireless power device 20.

In FIGS. 3 and 4, the emulated object 66 is illustrated as a circle. However, the emulated object 66 could take any form, thickness or shape suitable to simulate a real foreign object. Examples of different shapes are shown in FIGS. 5a-d, shown from a top view perspective. FIG. 5a, shows an emulated object 66 in the form of a cylindrical shape, FIG. 5b shows an emulated object 66 in the form of an irregular shape, FIG. 5c shows an emulated object 66 in the form of a shape similar to a paper clip, and FIG. 5d shows an emulated object 66 in the form of a shape similar to a key. As should be understood by a person skilled in the art, the emulated object 66 could have a uniform thickness or a varying thickness. Moreover, although FIGS. 3 and 4 only show embodiments having one emulated object 66, it should be understood that the foreign object emulation device 60 could be arranged with a plurality of objects 66. If more emulated objects 66 are present, these could be of the same kind or differ in shape and/or thickness.

Figure 6A:
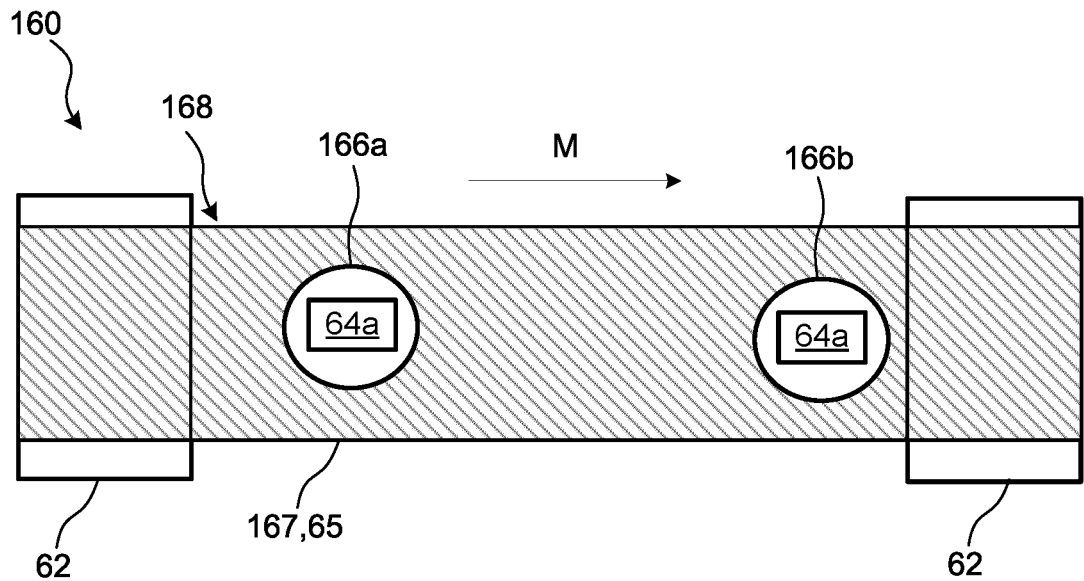
FIGS. 6a-b are schematic views of a foreign object emulation device according to one embodiment.
Figure 6B:
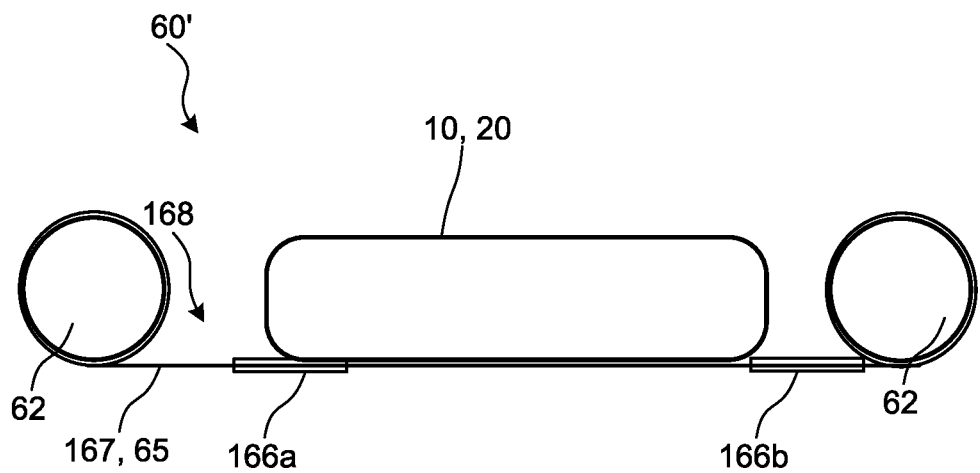

FIGS. 6a-b illustrates another embodiment of the foreign object emulation device 160, where FIG. 6a illustrates the foreign object emulation device 160 in a top view perspective, and FIG. 6b illustrates the foreign object emulation device 160 in a side view perspective. The embodiment comprises a sensor unit 64 comprising at least one temperature sensor 64a configured to transmit temperature data to the processing means 61; 42; 52, wherein the temperature data is indicative of the temperature of the at least one emulated object as has been described with reference to other embodiments herein.

The foreign object emulation device 160 comprises a main body 168. The main body comprises longitudinal arrangement 167 configured to guide the movement of the at least one emulated object 166a, 166b. In this embodiment, two foreign objects are present 166a, 166b arranged in a spaced apart relationship. However, as should be understood, the foreign object emulation device 160 could comprise only one foreign object, or more than two foreign objects.

The longitudinal arrangement 167 may be seen as a movable member onto which the foreign objects 166a, 166b are arranged on. The movable member 167 may be a thin material, for example in the form of an adhesive tape. It is preferred if the movable member 167 is flexible. If the movable member 167 is in the form of an adhesive tape, the foreign objects 166*a*, 166*b* may be attached to the adhesive tape 167. The movable member 167 preferably has a width that is large enough to accommodate at least one foreign object 166*a*, 166*b*.

In this embodiment, the movable member 167 can be seen as the means 65 for causing a controlled movement or as a part of the means 65 for causing a controlled movement.

The movable member 167 is preferably arranged in conjunction with two drive units 62. The drive units 62 are preferably arranged in a spaced apart relationship, and the movable member 167 is arranged in between the two drive units 62. The drive units 62 may be in the form of drums that moves the movable member 167. As indicated by the arrow M in FIG. 6*b*, the movable member 167 moves in a direction along the length of the movable member 167. Hence, the at least one drive unit 62 is configured to move said at least one emulated object relative the wireless power device 10; 20 being tested.

The wireless power device 10, 20, as shown in FIG. 6*b*, is arranged to be arranged on top of the longitudinal arrangement 167 when being tested.

Figure 7A:
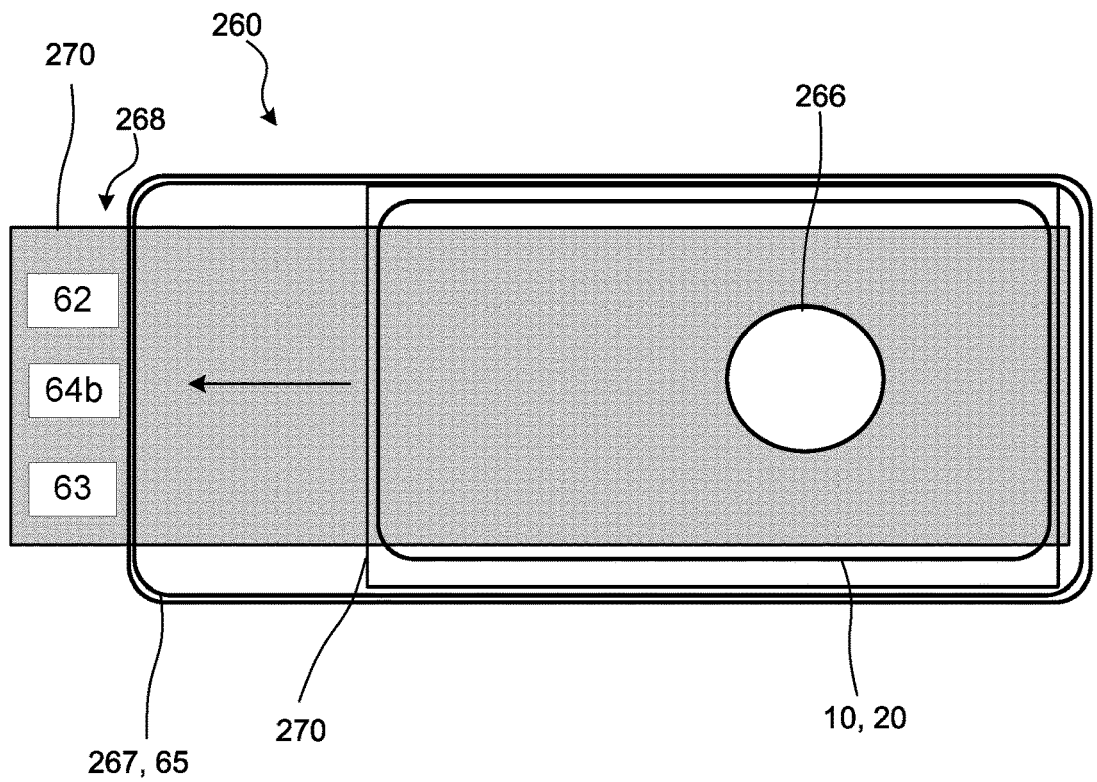
FIGS. 7a-b are schematic views of a foreign object emulation device according to one embodiment.
Figure 7B:
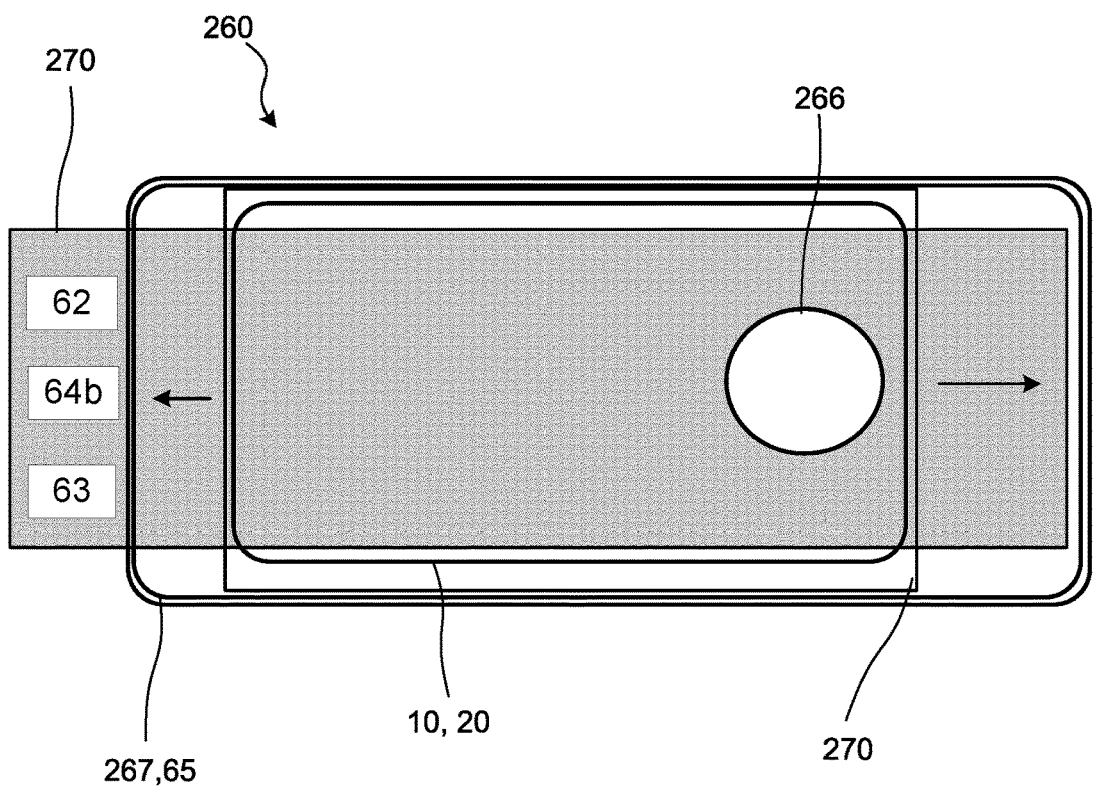

FIGS. 7*a-b* show yet another embodiment of the foreign object emulation device 260. The foreign object emulation device 260 comprises a main body 268 being arranged with at least one emulated object 266. The embodiment comprises a sensor unit 64 comprising at least one temperature sensor 64*a* configured to transmit temperature data to the processing means 61; 42; 52, wherein the temperature data is indicative of the temperature of the at least one emulated object as has been described with reference to other embodiments herein.

The main body 268 further comprises a longitudinal arrangement 267 configured to guide the movement of the wireless power device 10; 20 being tested. The longitudinal arrangement 267 may be seen as a frame into which the wireless power device 10; 20 is guided. The wireless power device 10; 20 is preferably arranged on a movable portion 270.

As is illustrated by the arrows in FIGS. 7*a-b*, the movable portion 270 is movable along the longitudinal arrangement 267. The movable portion 270 may for example be a slidable portion that is configured to be slid along tracks along the length of the longitudinal arrangement 267. In this embodiment, the longitudinal arrangement 267 and/or the movable portion 270 can be seen as the means 65 for causing controlled movement or as a part of the means 65 for causing a controlled movement.

The device 260 further comprises or is in operative communication with at least one drive unit. The drive unit is configured to cause the relative movement of the wireless power device 10; 20 being tested and the at least one emulated object.

The main body 268 further comprises a support arrangement 270. The support arrangement 270 is configured to hold the at least one emulated object 266. The support arrangement 270 may be in the form of a plate. The plate 270 may extend along the length of the longitudinal arrangement 267.

Figure 8A:
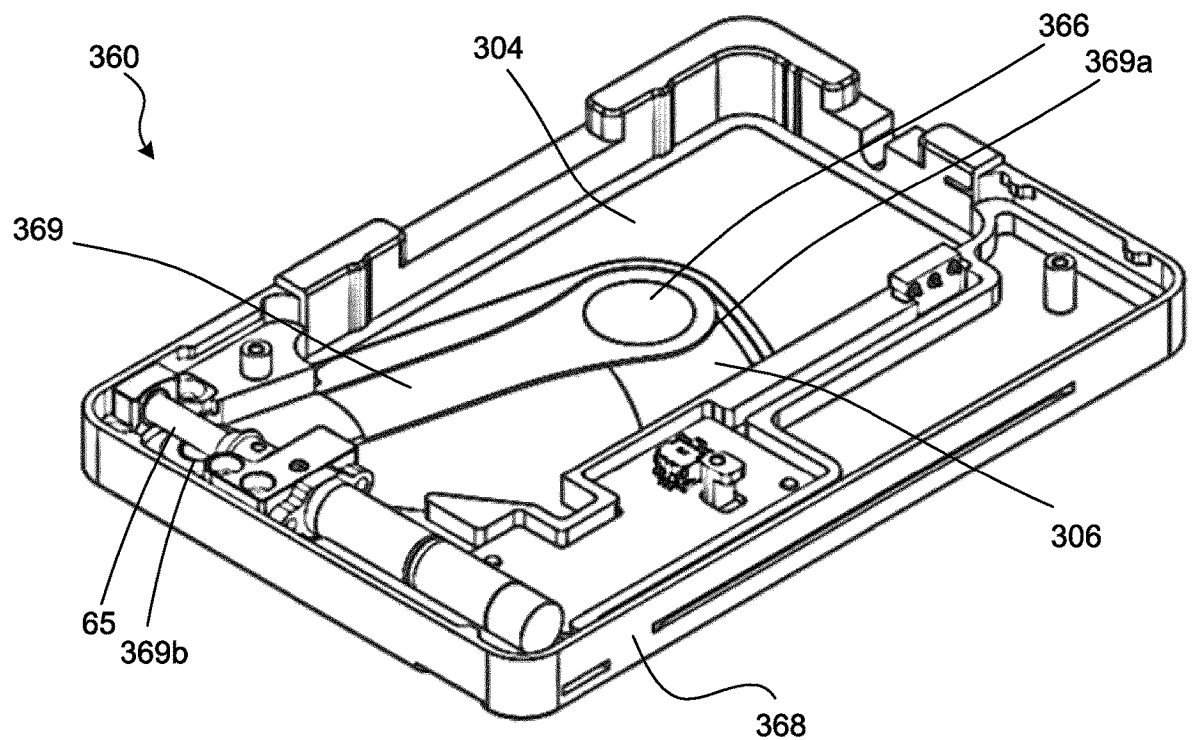
FIGS. 8a-c are schematic views of a foreign object emulation device according to one embodiment.
Figure 8B:
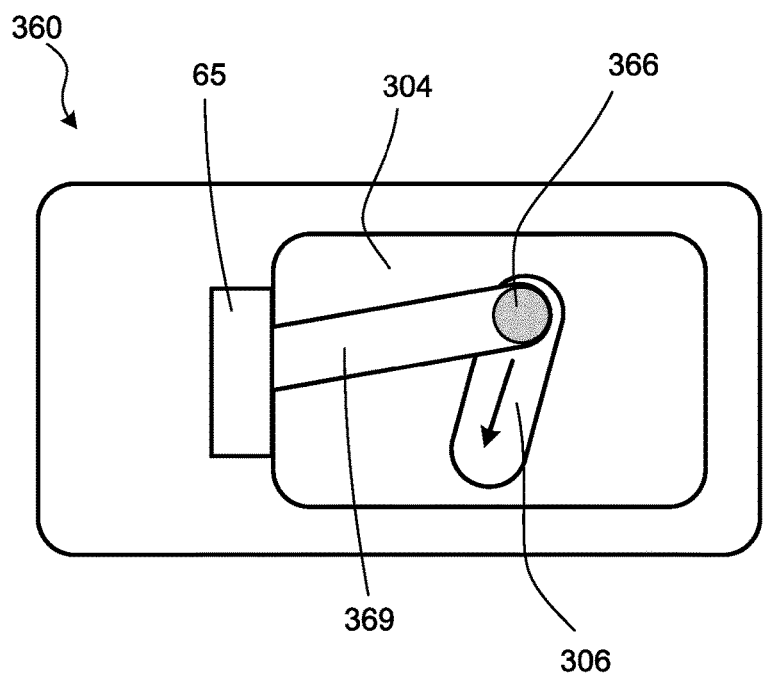
Figure 8C:
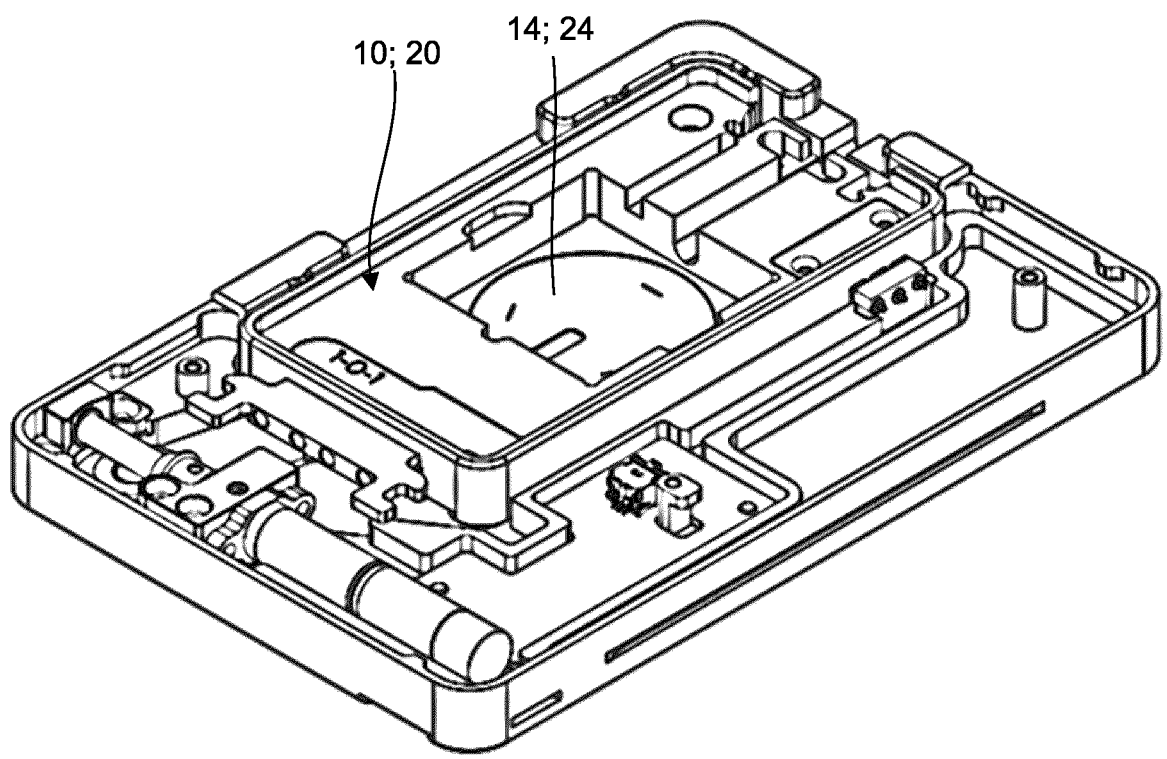

FIGS. 8*a-c* show cross-sectional views of a foreign object emulation device 360 according to one embodiment. In FIG. 8-*b*, the foreign object emulation device 360 is shown without being arranged with the wireless power device 10; 20. FIG. 8*c* shows the foreign object emulation device 360 when it is arranged with the wireless power device 10:20.

The foreign object emulation device 360 comprises a main body 368 having a recess 304 for receiving the wireless power device 10; 20. The recess 304 is adapted to accommodate the wireless power device 10; 20. The shape of the recess 304 is preferably the same shape as the wireless power device 10; 20 to be placed therein.

The recess 304 may optionally comprise one or more fastening units (not shown). The fastening units may for instance be clamps, clasps, or brackets, or similar means adapted to releasably arrange the wireless power device 10; 20 within the recess 304 of the main body 368.

The foreign object emulation device 360 further comprises an arm 369. The arm 369 is arranged inside the recess 304 of the main body 368. The arm 369 comprises a first movable end 369*a* and a second fixed end 369*b*.

The arm 369 further comprises an emulated object 366. The arm 369 may thus be seen as a support arrangement for supporting the emulated object 366. The emulated object 366 is configured to be arranged at the first movable end 369*a* of the arm 369. The emulated object 366 may be arranged in a recess of the arm, or being attached onto the arm in another suitable way.

The second fixed end 369*b* of the arm 369 is connected to a driving means 65. The driving means 65 is adapted to cause a controlled relative movement of the arm 369 in relation to the wireless power device 10; 20 being tested. The driving means 65 may be connected to the main body 368 via fastening means (not shown), such as one or more screws, bolts or nuts.

The movable end 369*a* of the arm 369 is movable in a track 306. The track 306 forms part of the recess 304 of the main body 368. The track 306 may be a recess in the surface of the recess 304. The track 306 may be cast, molded or milled into the main body 368. The track 306 is adapted to receive the arm 369, and more specifically the first movable end 369*a* of the arm 369. Accordingly, the first movable end 369*a* of the arm 369 is arranged within the track 306 in a sliding engagement. The sliding engagement enables the driving means 65 to cause movement of the emulated object 366 along the track 306 and in relation to the wireless power device 10; 20 being tested. The movement is illustrated by the arrow in FIG. 8*b*.

Hence, the arm 369 and thus the emulated object 366 arranged thereon can be moved along different positions of the wireless power device 10; 20 which is placed on top of the recess 304. In other words, the wireless power device 10; 20 is arranged in a static position while the emulated object 366 is moved in a controlled manner.

The foreign object emulation device 360 as described in relation to FIGS. 8*a-c* may further comprise a temperature sensor and/or a position sensor as described in relation to the other embodiments disclosed herein. Moreover, guiding and positioning of the emulated object 366 may be performed in accordance with the other embodiments described throughout the present disclosure.

Figure 9:
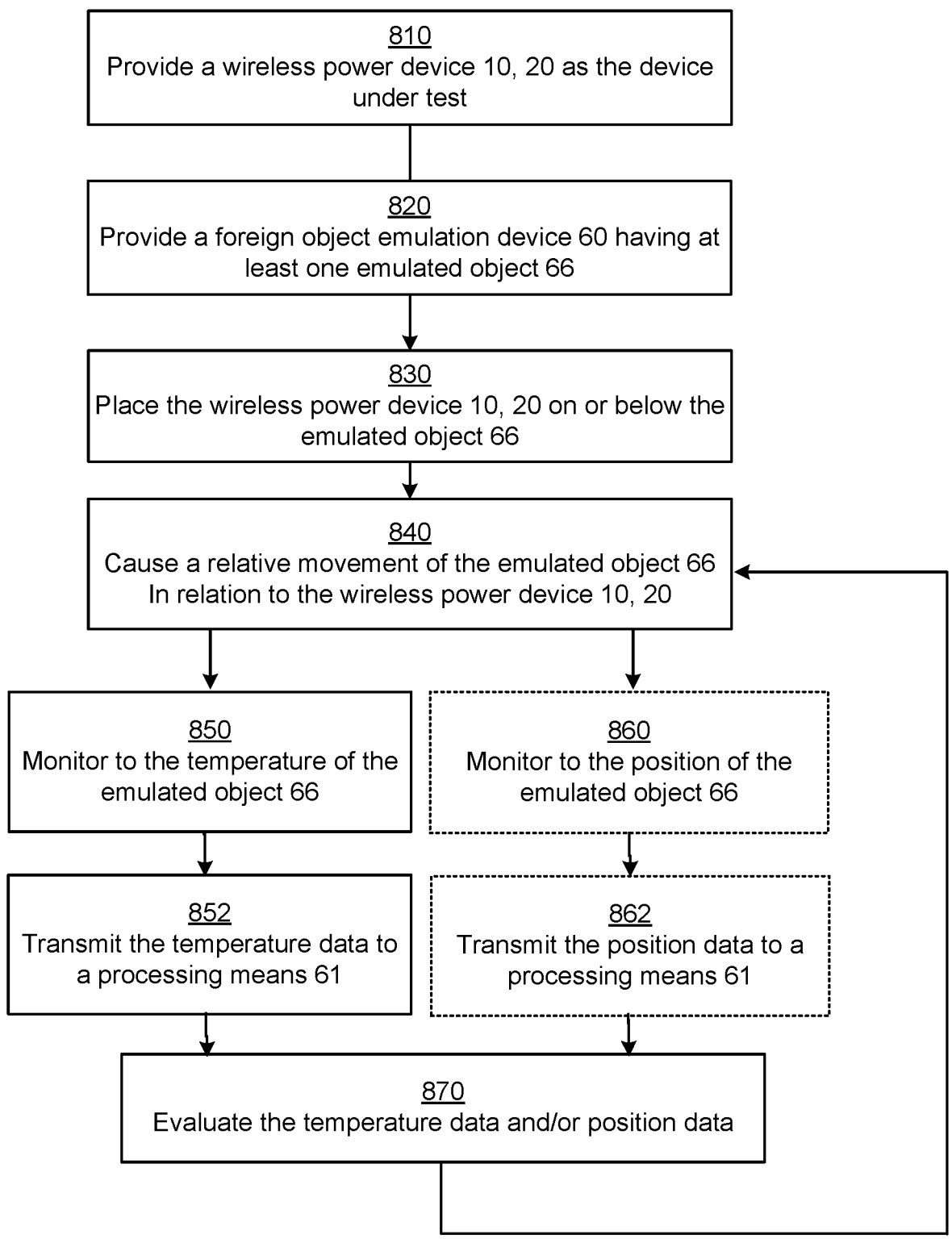
FIG. 9 is a schematic block diagram of a method of testing a wireless power transmitter device using a foreign object emulation device according to FIG. 3 or FIG. 4.

FIG. 9 illustrates an exemplified method for testing how a wireless power device 10, 20 reacts to an emulated foreign object 66. In a first step 810, a wireless power device 10, 20 to be tested is provided. The wireless power device 10 could be a wireless power transmitter device 20 or a wireless power receiver device 10.

A foreign object emulation device 60, as has been described herein, is also provided 820. The wireless power device 10, 20 is placed on a surface in conjunction with the foreign object emulation device 60. The wireless power device 10, 20 is either placed 830 above the emulated object 66 of the foreign object emulation device 60 or below it.

In one embodiment, the method comprises the step of causing a relative movement 840 of the emulated object in relation to the wireless power device being tested. The step of causing the controlled relative movement may comprise instructing a drive unit, which is in operative communication with the foreign object emulation device 60, to move the at least one emulated object and/or to move the wireless power device.

In one embodiment, the processing means 61 instructs the drive unit 62 to move 840 the emulated object 66 along a predetermined path in small steps. The steps are preferably in the sub-millimeter scale. The drive unit 62 is preferably controlled wirelessly by the processing means 61. The drive unit 62 may be configured to follow a predefined protocol stored in an associated memory to the processing means 61, and/or the drive unit 62 is configured to follow instructions caused by a user of the processing means 61. The drive unit may be arranged as a part of the foreign object emulation device 60 or as a separate external part, being in operative communication with the foreign object emulation device 60.

In an alternative embodiment, the processing means 61 instructs the drive unit 62 to move 840 the wireless power device 10, 20 along a predetermined path in small steps. The steps are preferably in the sub-millimeter scale. The drive unit 62 is preferably controlled wirelessly by the processing means 61. The drive unit 62 may be configured to follow a predefined protocol stored in an associated memory to the processing means 61, and/or the drive unit 62 is configured to follow instructions caused by a user of the processing means 61.

If present, the position sensor 64*b* monitors 860 the position of the emulated object 66 at every movement. The position data is transmitted 862 to the processing means 61. The processing means 61 evaluates 870 the position data.

In one embodiment, the temperature sensor 64*a* is configured to measure the temperature on the emulated object 66 once the movement of the emulated object 66 has stopped. The temperature sensor 64*a* is thus configured to monitor 850 the temperature of the emulated object 66. The temperature sensor 64*a* may be configured to transmit the actual temperature data to the processing means 61 and/or may be configured to transmit temperature deviations to the processing means 61.

The temperature data is transmitted 852 to the processing means 61 using the interface 63. The processing means 61 is configured to evaluate 870 the received temperature data. A rise in temperature is indicative of any electromagnetic energy absorbed in the emulated object 66.

In one embodiment the processing means 61 is configured to evaluate both the temperature data and the position data. It is preferred if the position data and temperature data for all possible combinations are stored in a memory of the processing means 61.

The process is repeated for every movement of the emulated object 66 until a satisfying number of positions have been tested and/or until the position or temperature data reaches a predetermined threshold.

In one embodiment, if the temperature data is above a predetermined threshold, the processing means 61 is configured to activate a threshold mode. The threshold mode may comprise generating and/or transmitting an alarm signal. The alarm signal may be transmitted to the wireless power device 10, 20 using the interface 63, instructing the wireless power device 10, 20 to turn off the wireless charging and/or to transmit an alarm in the form of a light, sound, etc. Additionally, or alternatively, the threshold mode may cause the drive unit to move the emulated object 66 away from the wireless power device 10, 20.

In one embodiment, if the position data is above a predetermined threshold the processing means 61 is configured to transmit an alarm signal in the form of a light, sound etc. informing the user that the emulated object 66 has reached one of its end positions.

The stored information about temperature and the position of the emulated object 66 in relation to the wireless power device 10, 20 may be shown to the user by a display. The display may be part of the reporting means 43; 53 (as shown in FIGS. 10-11), part of the processing means 62 or part of an external device.

The display may show information for example in the form of a text box or a table or a graphical illustration. The information may for example comprise information of the temperature in relation to the position of the emulated object 66, information of the operating parameters of the wireless power device 10, 20 and/or information of the emulated object 66 being used. Additionally, or alternatively, the interactive display may allow the user to adjust the movement of the at least one emulated object 66. This may for example be done by showing a plurality of graphical objects that represents symbols, such as arrows in the desired movement direction.

Figure 12:
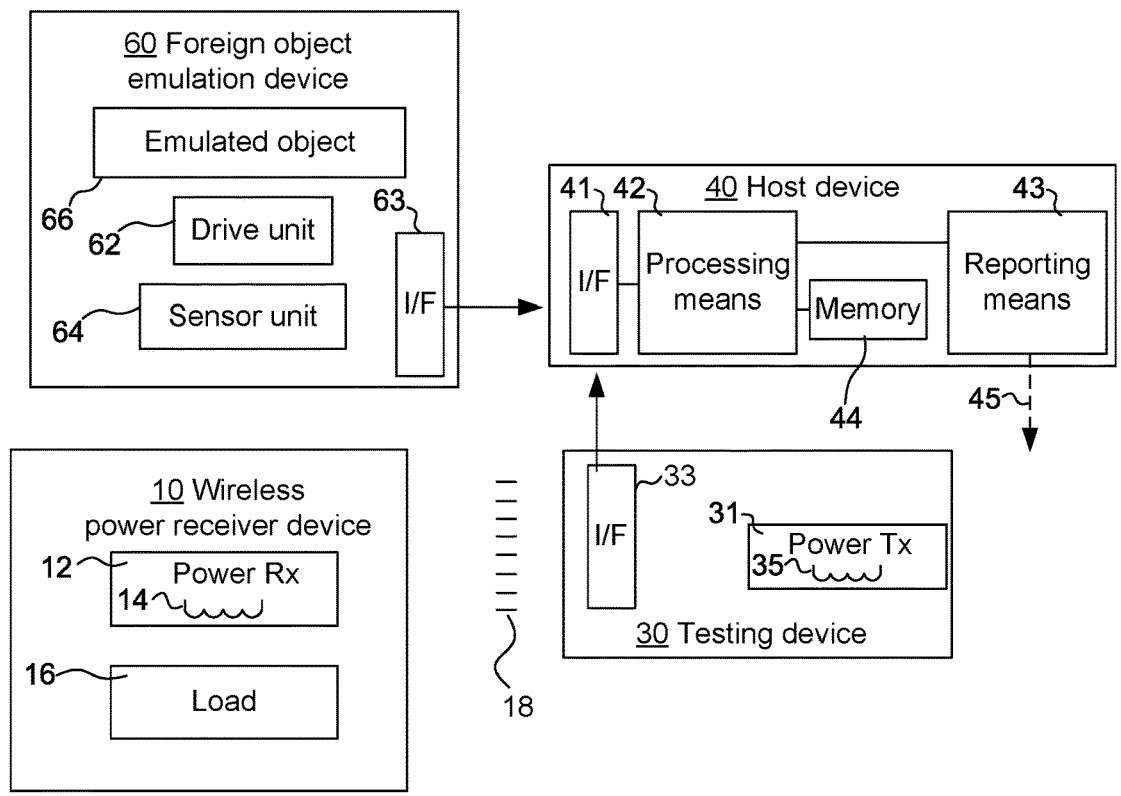
FIG. 12 is a schematic block diagram of a foreign object emulation device for use in testing of a wireless power receiver device according to one embodiment.
Figure 13:
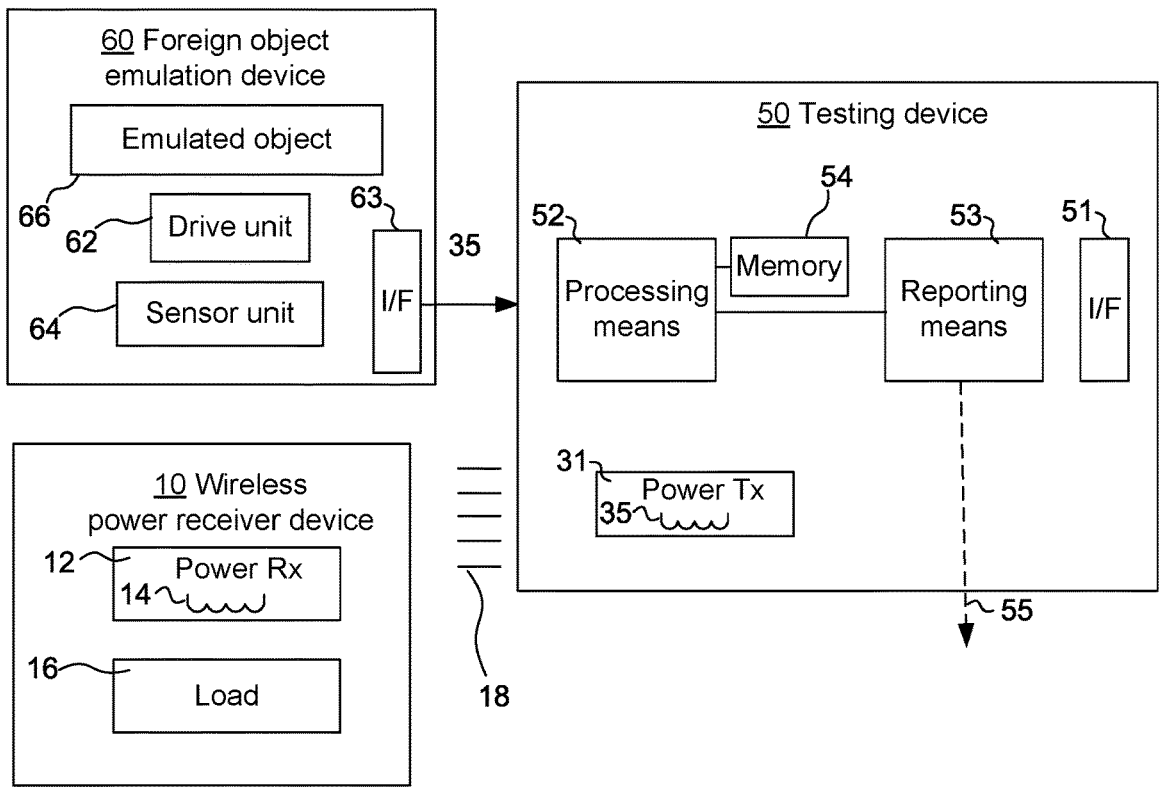
FIG. 13 is a schematic block diagram of a foreign object emulation device for use in testing of a wireless power receiver device according to one embodiment.
Figure 14A:
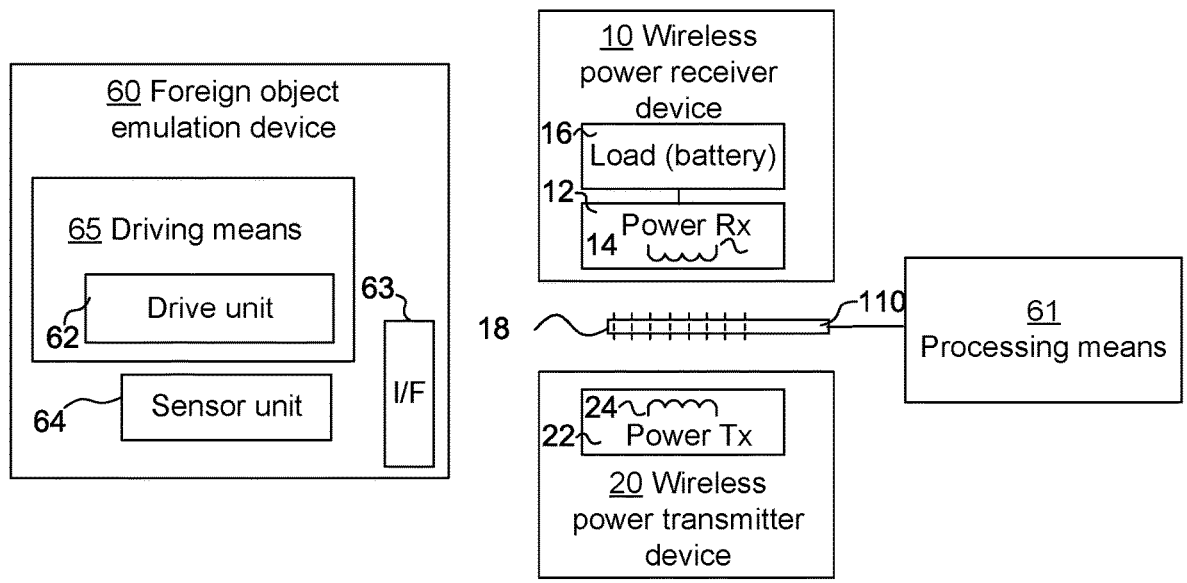
FIGS. 14-b are schematic block diagrams of a foreign object emulation device comprising a probe device according to one embodiment.
Figure 14B:
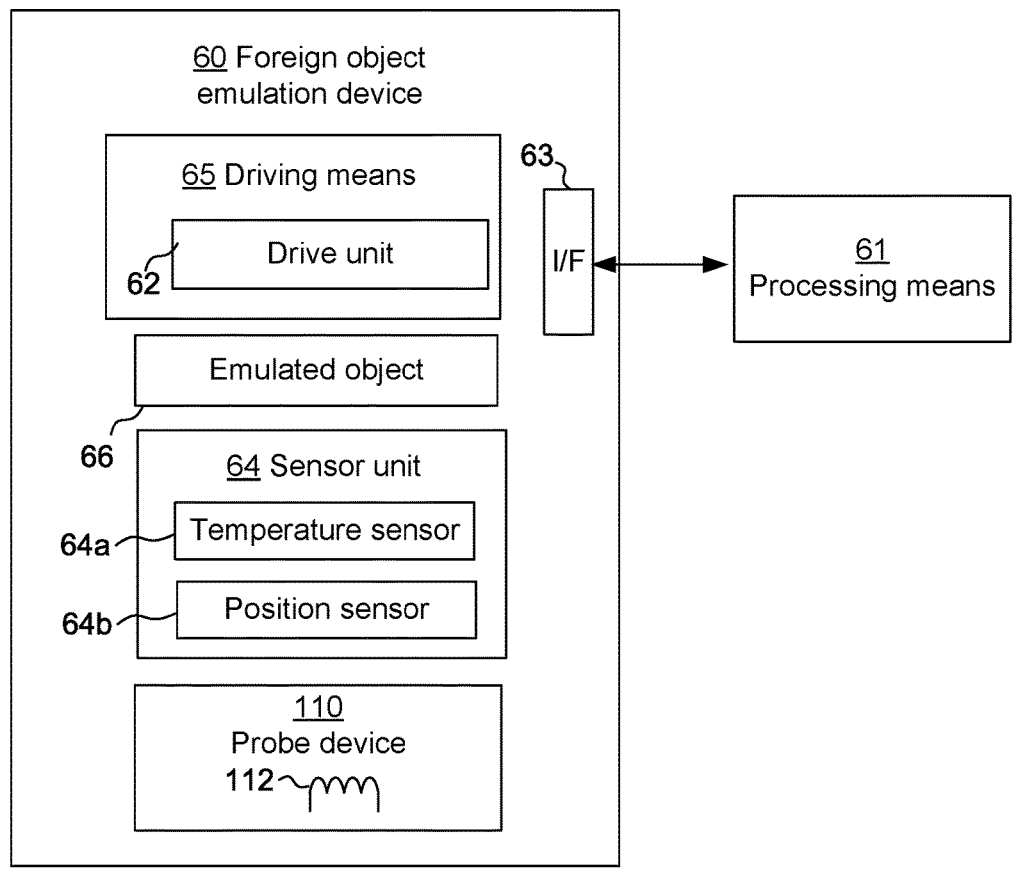

The foreign object emulation device 60 could be used in isolation, or in combination with a testing device and/or a wireless probe device. FIGS. 10 and 11 are schematic block diagrams that show two embodiments of a system comprising a testing receiver device 30; 50 for testing a wireless power transmitter device 20 together with a foreign object emulation device 60. FIGS. 12 and 13 are schematic block diagrams that show two embodiments of a system comprising a testing transmitter device 30', 50' for testing a wireless power receiver device 10 together with a foreign object emulation device 60. FIGS. 14*a-b* is a schematic block diagram of a wireless probe device 110 together with a foreign object emulation device 60.

Figure 10:
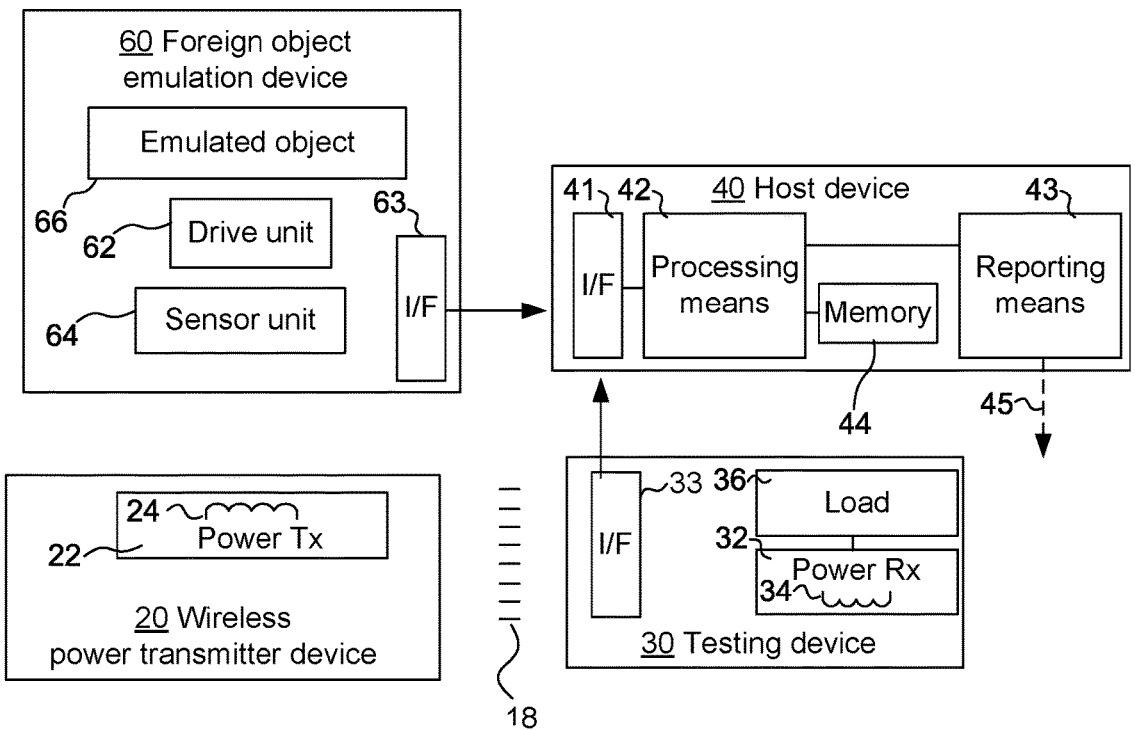
FIG. 10 is a schematic block diagram of a foreign object emulation device for use in testing of a wireless power transmitter device according to one embodiment.
Figure 11:
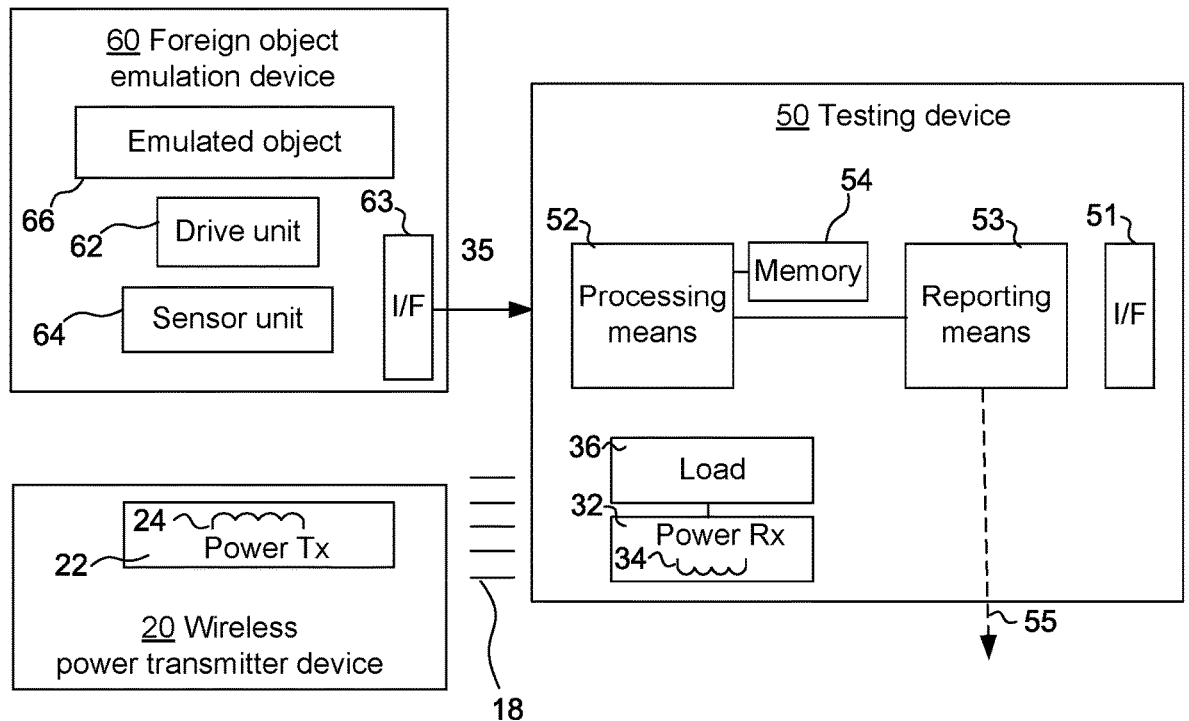
FIG. 11 is a schematic block diagram of a foreign object emulation device for use in testing of a wireless power transmitter device according to one embodiment.

First turning to FIGS. 10 and 11, both embodiments comprise a testing device 30; 50 having a wireless power receiver 32 with at least one wireless power receiver coil 34. Moreover, the testing device 30; 50 is in in operative communication with a processing means 42; 52 (e.g. a controller) and its associated memory 44; 54, either by having the processing means 52 arranged in the testing device 50 itself (as in FIG. 11) or by being in communication with a host device 40 having the processing means 42 (as in FIG. 10).

In operation during a test session, the wireless power transmitter device 20 will initiate a wireless transfer of power to the testing device 30; 50 by way of magnetic induction 18 via the wireless power transmitter coil(s) 24 and the wireless power receiver coil(s) 34 during an operational time of a test session.

A suitable load 36 may be provided to handle excess power received by the wireless power receiver coil 34 in the testing device 30; 50. For instance, a suitably dimensioned resistor may be used.

The different embodiments of the testing device 30; 50 will now be described more in detail.

FIG. 10 is a schematic block diagram which shows a testing device 30 for testing a wireless power transmitter device 20 (device under test) under the control of a host device 40. The host device 40 has an interface 41 for receiving the data obtained by the testing device 30. The interfaces 33 and 41 may be of any suitable type, including simple wiring, a serial interface such as USB, a wireless interface such as Bluetooth of WiFi, etc. The testing device 30 may for example have a cable which may be part of the interface 33 to the host device 40.

The host device 40 also has processing means 42 for processing the data received from the testing device 30. The processing means 42 may be the same as has been described with reference to FIG. 2-6. The processing means 42 is connected to or comprises a computer readable storage medium such as a disk or memory 44. The memory 44 may be configured to store data relating to the test session.

Furthermore, the host device 40 has reporting means 43 for communicating or presenting the data processing results obtained by the processing means 42. This may involve presentation of graphical information on a local user interface (e.g. display) of the host device 40, generating of visual and/or audible alarms, or communication of information to an external device, as seen at 45. Such an external device may for example be a computer or a mobile phone.

FIG. 11 is a schematic block diagram that shows a testing device 50 according to another embodiment. The testing device 50 comprises processing means 52 for processing the data received from the testing device 50. The processing means 52 may be the same as has been described with reference to FIG. 2-8. The processing means 52 is connected to or comprises a computer readable storage medium such as a disk or memory 54. The memory 54 may be configured to store data relating to the test session. Furthermore, the testing device 50 may have reporting means 53 for communicating or presenting the data processing results obtained by the processing means 52. This may involve presentation of graphical information on a local user interface (e.g. display) of the testing device 50, generating of visual and/or audible alarms, or communication of information to an external device, as seen at 55. Such an external device may for example be a computer or a mobile phone. Additionally to the reporting means 53 or alternatively, the testing device 50 may further have a communication interface 51 for receiving data from the wireless power transmitter device 20. The communication interface 51 may be of any suitable type, including simple wiring, a serial interface such as USB, a wireless interface such as Bluetooth of WiFi, etc.

The testing device 30; 50 may have any suitable shape. In one embodiment the testing device 30; 50 is arranged in a way that allows testing of the wireless power transmitter device 20 in a situation where the testing device 30; 50 emulates a mobile device. In that situation, the testing device 30; 50 may be similar in shape to a smartphone, for example having essentially the shape of a thin box with rounded edges and corners.

In one embodiment, the testing device could be an end user device, such as a consumer device, that has a testing mode. Hence, the testing device could be a mobile device such as for instance, a mobile terminal (e.g. smartphone), tablet computer (e.g. surfpad), laptop computer or another kind of consumer product or appliance being configured with a testing mode.

The testing device 30; 50 comprises a housing having a bottom side adapted for placement on a surface of the wireless power transmitter device 20. Moreover, the housing comprises a top side opposite to the bottom side. At least some parts of the housing are made of plastic or another material suitable for admitting inductive coupling between the wireless power transmitter coil(s) 24 of the wireless power transmitter device 20 and the wireless power receiver coil 34 of the testing device 30; 50.

FIGS. 12 and 13 are schematic block diagrams that show two embodiments of a system comprising a testing device 30'; 50' for testing a wireless power receiver device together with a foreign object emulation device 60, where both embodiments comprise a testing device 30'; 50' having a wireless power transmitter 31 with at least one wireless power transmitter coil 35. Similar to the embodiments of FIGS. 10 and 11, the testing device 30'; 50' is in in operative communication with a processing means 42; 52 (e.g. a controller) and its associated memory 44; 54, either by having the processing means 52 arranged in the testing device 50 itself (as in FIG. 13) or by being in communication with a host device 40 having the processing means 42 (as in FIG. 12).

In operation during a test session, the testing device 30'; 50' will initiate a wireless transfer of power to the wireless power receiver device 10 by way of magnetic induction 18 via the wireless power transmitter coil(s) 35 and the wireless power receiver coil(s) 14 during an operational time of a test session.

The testing device 30'; 50' may have any suitable shape. In one embodiment the testing device 30'; 50' is arranged in a way that allows testing of the wireless power receiver device 10 in a situation where the testing device 30'; 50' emulates a wireless charger. In that situation, the testing device 30'; 50' may be similar in shape corresponding to a wireless charger.

In one embodiment, the testing device could be an end user device, such as a consumer device, that has a testing mode. Hence, the testing device could be a wireless charger or another kind of consumer product or appliance being configured with a testing mode having a wireless transmitter coil.

The novel and inventive foreign object emulation device 60 described with reference to FIGS. 2-13 can be used, verified, certified, trimmed and/or calibrated using a probe device 110. FIGS. 14a-b illustrates a system comprising a wireless probe device 110 for testing a wireless power device 10, 20 together with a foreign object emulation device 60. In FIG. 14a, the probe device 110 is a separate component in the system, and in FIG. 14b, the probe device 110 is integrated into the foreign object emulation device 60.

The probe device 110 will first be described with reference to FIG. 14a. The probe device 110 is arranged for testing of wireless power equipment in the form of a wireless power transmitter device 20 and/or a wireless power receiver device 10. The probe device comprises at least one pickup coil 112. The pickup coil 112 is adapted to be placed between a surface of a housing of the wireless power transmitter device 20 and a surface of a housing of the wireless power receiver device 10. This will enable the pickup coil 112 to generate electric signals by capturing electromagnetic signals exchanged between the wireless power transmitter 20 and receiver devices 10 pursuant to a wireless power transfer protocol.

The probe device 132 either comprises or is operatively connected to the analyzer device for providing the electric signals generated by the pickup coil 112. The analyzer device may be a part of or being the processing means 61. For this, the probe device 110 also comprises an interface for providing the electric signals generated by the pickup coil 112 to a processing means 61.

The probe device 110 may further comprise other sensors such as temperature sensors, etc., and sensor data from these sensors may also be received by the processing unit through the interface.

The probe device 110 is preferably used in a system, and the system preferably comprises means for causing manipulation of the electromagnetic signals exchanged between the wireless power transmitter and receiver devices 20, 10. The means for causing manipulation of the electromagnetic signals may, for instance, comprise a resistive element coupled to impose a controllable load on the pickup coil 112 of the probe device 110. Such a resistive element may be comprised in the processing means 61, be an external element or may be comprised in the probe device 110 itself. Alternatively, means for causing manipulation of the electromagnetic signals may comprises an AM modulator for causing an amplitude modulation of the electromagnetic signals exchanged between the wireless power transmitter and receiver devices 20, 10, wherein the AM modulator is controllable by the processing means. Thanks to the provision of the controllable load (for instance imposed by the resistive element), the system may be configured for controllable interception, e.g. by the resistive element, of wireless power transmitted by the wireless power transmitter device 20, so as to cause transfer of less wireless power than expected between the wireless power transmitter and receiver devices 20, 10.

Now turning to the specific embodiment of FIG. 14b, where the probe device 110 is a part of the foreign object emulation device 60. The probe device 110 is preferably in communication with the interface 63 for providing the electric signals generated by the pickup coil 112 to the processing means 61.

In this embodiment it is preferred if the resistive element is comprised in the foreign object emulation device 60. For example, the resistive element may be comprised in the probe device 110 and be coupled to the pickup coil 112 therein, wherein the resistive element is controllable by the processing unit via the interface of the foreign object emulation device 60.

As mentioned, the analyzer device 110 will be very useful in detecting if the device under test is performing as intended and provide output to that respect. The output may be provided to an internal or external storage means, a user of the device or to the host device. In short, the probe device 110 will provide signals to the analyzer device such that the analyzer can determine if the wireless power transfer is operating in a power transfer phase. If that it is the case, the analyzer device 110 will be configured to detect if one of the power transmitter device 120 or the power receiver device 110 transmits a first data packet. The analyzer device 110 will be configured to detect that a data communication configurational change is performed by the device 110, 120 transmitting the first packet. The analyzer device 110 may optionally be configured to monitor the inductive wireless power transfer interface and detect if the signaling condition is fulfilled. The analyzer device 110 may further be configured to detect if e.g. a data communication configurational change is performed without the signaling condition being fulfilled. Any detected deviations or violations of the processes described herein may result in the analyzer device 110 generating output indicating the deviation or violation.

The invention has been described above in detail with reference to embodiments thereof. However, as is readily understood by those skilled in the art, other embodiments are equally possible within the scope of the present invention, as defined by the appended claims.

The invention claimed is:

1. A foreign object emulation device for testing foreign object detection of a wireless power device having at least one wireless power coil, wherein the foreign object emulation device is in operative communication with a processing means, wherein the foreign object emulation device comprises:
   a main body being arranged with at least one emulated object,
   a sensor unit comprising at least one temperature sensor configured to transmit temperature data to the processing means, wherein the temperature data is indicative of the temperature of the at least one emulated object, and wherein the processing means is configured to receive the temperature data, and at least based on said temperature data instruct the drive unit to move the at least one emulated object and/or the wireless power device, and
   means for causing a controlled relative movement between the at least one emulated object and the wireless power device being tested, wherein the means for causing controlled relative movement is in operative communication with a drive unit.

2. The foreign object emulation device as defined in claim 1, being in operative communication with at least one position sensor configured to transmit position data to the processing means, wherein the position data is indicative of the position of the at least one emulated object in relation to the wireless power device.

3. The foreign object emulation device as defined in claim 1, wherein the processing means is configured to receive the position data, and at least based on said position data instruct the drive unit to move the at least one emulated object and/or the wireless power device.

4. The foreign object emulation device as defined in claim 1, further comprising a probe device.

5. The foreign object emulation device as defined in claim 1, wherein the temperature data is transmitted to the processing means using wireless communication.

6. The foreign object emulation device as defined in claim 1, wherein the processing means is arranged in a host device being in communication with the foreign object emulation device.

7. The foreign object emulation device as defined in claim 1, wherein the wireless power device is a wireless power transmitter device in the form of a wireless charger.

8. The foreign object emulation device as defined in claim 1, wherein the wireless power device is a wireless power receiver device.

9. A system for testing foreign object detection of a wireless power device having at least one wireless power coil, the system comprising a foreign object emulation device as defined in claim 1 and a host device being arranged with a processing means.

10. A method for testing foreign object detection of a wireless power device having at least one wireless power coil, the method comprising:
   providing a foreign object emulation device having a main body being arranged with at least one emulated object, a drive unit and a sensor unit comprising at least one temperature sensor,
   causing a controlled relative movement between the emulated object and the wireless power device being tested, wherein the means for causing controlled relative movement is in operative communication with a drive unit,
   transmitting temperature data, generated by the at least one temperature sensor, being indicative of the temperature of the at least one emulated object to a processing means being in operative communication with the foreign object emulation device,
   receiving, by the processing means, said temperature data,
   at least based on said temperature data, transmitting instructions to the drive unit to move the at least one emulated object, and causing a relative movement between the at least one emulated object and the wireless power device.

11. The method as defined in claim 10, wherein the foreign object emulation device is in operative communication with at least one position sensor, wherein the method further comprises:
 transmitting position data, generated by the at least one position sensor, being indicative of the relative position of the at least one emulated object to the processing means.

12. The method as defined in claim 11, further comprising:
 receiving, by the processing means, said position data,
 at least based on said position data, transmitting instructions to the drive unit to move the at least one emulated object, and
 causing a relative movement between the at least one emulated object and the wireless power device.

13. A non-transitory computer readable medium encoded with instructions that, when loaded and executed by a processing means, cause the method according to claim 10 to be performed.

\* \* \* \* \*